(12) United States Patent
Wu

(10) Patent No.: US 11,456,377 B2
(45) Date of Patent: Sep. 27, 2022

(54) SEMICONDUCTOR DEVICE AND METHOD FOR MANUFACTURING THE SAME

(71) Applicant: GPOWER SEMICONDUCTOR INC., Suzhou (CN)

(72) Inventor: Chuanjia Wu, Suzhou (CN)

(73) Assignee: GPOWER SEMICONDUCTOR INC., Suzhou (CN)

( * ) Notice: Subject to any disclaimer, the term of this patent is extended or adjusted under 35 U.S.C. 154(b) by 120 days.

(21) Appl. No.: 16/862,766

(22) Filed: Apr. 30, 2020

(65) Prior Publication Data

US 2020/0259010 A1 Aug. 13, 2020

Related U.S. Application Data

(63) Continuation of application No. PCT/CN2019/085317, filed on Apr. 30, 2019.

(30) Foreign Application Priority Data

May 3, 2018 (CN) .......................... 201810414136.5

(51) Int. Cl.
*H01L 29/778* (2006.01)
*H01L 29/45* (2006.01)
*H01L 29/66* (2006.01)

(52) U.S. Cl.
CPC .......... *H01L 29/778* (2013.01); *H01L 29/452* (2013.01); *H01L 29/66462* (2013.01)

(58) Field of Classification Search
CPC ................. H01L 29/778; H01L 29/452; H01L 29/66462; H01L 29/402; H01L 29/42316; H01L 29/1066; H01L 29/7786; H01L 29/2003; H01L 29/0619
See application file for complete search history.

(56) References Cited

U.S. PATENT DOCUMENTS

| 2014/0138704 A1* | 5/2014 | Tanaka ................. H01L 29/778 257/76 |
| 2015/0076563 A1* | 3/2015 | Yu ..................... H01L 21/02631 257/194 |

\* cited by examiner

*Primary Examiner* — Mohammed R Alam
(74) *Attorney, Agent, or Firm* — Westbridge IP LLC

(57) ABSTRACT

The semiconductor device includes: a substrate; a semiconductor layer disposed on one side of the substrate, the semiconductor layer including a channel layer and a barrier layer, and a two-dimensional electron gas being formed at an interface between the channel layer and the barrier layer; a source, a gate, and a drain disposed on one side of the semiconductor layer away from the substrate; and at least two drain junction terminals located on the side of the semiconductor layer away from the substrate and disposed at intervals between the gate and the drain, the at least two drain junction terminals being electrically connected to the drain respectively. In the embodiments of the present application, the on-resistance of the device can be reduced while the current collapse phenomenon is eliminated, thereby improving the long-term reliability of the device.

10 Claims, 4 Drawing Sheets

SEMICONDUCTOR DEVICE AND METHOD FOR MANUFACTURING THE SAME

CROSS-REFERENCE TO RELATED APPLICATIONS

The present application is a continuation of International Application No. PCT/CN2019/085317 filed on Apr. 30, 2019, which claims priority to Chinese patent application No. 201810414136.5 filed on May 3, 2018. Both applications are incorporated herein by reference in their entireties.

TECHNICAL FIELD

Embodiments of the present application relate to the field of semiconductor technologies, in particular to a semiconductor device and a method for manufacturing the same.

BACKGROUND

Nitride semiconductor materials, including GaN, have high saturated electron mobility, a high breakdown voltage, and a wide band gap. Because of these characteristics, GaN-based High Electron Mobility Transistor (HEMT) devices attract the attention of many researchers and semiconductor manufacturers. In the next 20 years, GaN HEMT devices will have a wide range of applications in the fields of high speed, high efficiency, and high frequency communications and power electronics.

In GaN power electronic devices, there is a serious current collapse phenomenon, which increases the power consumption of the devices and reduces the operating efficiency of the devices.

SUMMARY

In view of this, embodiments of the present application provide a semiconductor device and a method for manufacturing the same, which can solve the above problems.

In a first aspect, embodiments of the present application provide a semiconductor device, including: a substrate; a semiconductor layer disposed on one side of the substrate, the semiconductor layer including a channel layer and a barrier layer, and a Two-Dimensional Electron Gas (2DEG) being formed at an interface between the channel layer and the barrier layer; a source, a gate, and a drain disposed on one side of the semiconductor layer away from the substrate; and at least two drain junction terminals located on the side of the semiconductor layer away from the substrate and disposed at intervals between the gate and the drain, the at least two drain junction terminals being electrically connected to the drain respectively.

In some embodiments of the present application, the at least two drain junction terminals are disposed along an extension direction from the gate to the drain, and a length of a drain junction terminal close to the drain in the at least two drain junction terminals in the extension direction is greater than that of a drain junction terminal close to the gate in the at least two drain junction terminals in the extension direction.

In some embodiments of the present application, the at least two drain junction terminals are disposed along an extension direction from the gate to the drain, and a thickness of a drain junction terminal close to the drain in the at least two drain junction terminals is greater than that of a drain junction terminal away from the drain in the at least two drain junction terminals.

In some embodiments of the present application, in a direction in which the gate faces the drain, a thickness of the at least two drain junction terminals gradually increases.

In some embodiments of the present application, a distance between the gate and a drain junction terminal close to the gate in the at least two drain junction terminals is greater than or equal to a distance between the drain and a drain junction terminal close to the drain in the at least two drain junction terminals.

In some embodiments of the present application, a spacing between two adjacent drain junction terminals close to the gate in the at least two drain junction terminals is greater than or equal to a spacing between two adjacent drain junction terminals close to the drain in the at least two drain junction terminals.

In some embodiments of the present application, in a direction in which the gate faces the drain, a spacing between two adjacent drain junction terminals in the at least two drain junction terminals gradually decreases.

In some embodiments of the present application, the at least two drain junction terminals include a first drain junction terminal, a second drain junction terminal, and a third drain junction terminal, the first drain junction terminal is disposed close to the gate, the third drain junction terminal is disposed close to the drain, and the second drain junction terminal is located between the first drain junction terminal and the third drain junction terminal, and a spacing between the first drain junction terminal and the second drain junction terminal is greater than a spacing between the second drain junction terminal and the third drain junction terminal.

In some embodiments of the present application, each drain junction terminal of the at least two drain junction terminals includes: a first growth semiconductor layer grown on one side of the semiconductor layer away from the substrate; and an ohmic electrode disposed on one side of the first growth semiconductor layer away from the semiconductor layer. The drain junction terminal is short-circuited to the drain through the ohmic electrode, and the at least two drain junction terminals respectively maintain equal potential with the drain.

In some embodiments of the present application, the semiconductor device further includes: a second growth semiconductor layer grown between the gate and the barrier layer. At least a portion of the second growth semiconductor layer extends to a surface of the barrier layer, an inside of the barrier layer, or an inside of the channel layer.

In some embodiments of the present application, the semiconductor device further includes: a dielectric layer located above the barrier layer. A gate trench is formed on the dielectric layer, and the gate trench extends from the dielectric layer to the surface of the barrier layer, the inside of the barrier layer, or the inside of the channel layer, and the second growth semiconductor layer between the gate and the barrier layer is located in the gate trench.

In a second aspect, embodiments of the present application also provide a method for manufacturing a semiconductor device, including: providing a semiconductor layer on one side of a substrate, the semiconductor layer including a channel layer and a barrier layer, and a two-dimensional electron gas being formed at an interface between the channel layer and the barrier layer; disposing at least two drain junction terminals on one side of the semiconductor layer away from the substrate at intervals; and disposing a source, a gate, and a drain on the side of the semiconductor layer away from the substrate, the at least two drain junction terminals being located between the gate and the drain, and being electrically connected to the drain respectively.

In some embodiments of the present application, the at least two drain junction terminals are disposed along an extension direction from the gate to the drain, and a length of a drain junction terminal close to the drain in the at least two drain junction terminals in the extension direction is greater than that of a drain junction terminal close to the gate in the at least two drain junction terminals in the extension direction.

In some embodiments of the present application, the at least two drain junction terminals are disposed along an extension direction from the gate to the drain, and a thickness of a drain junction terminal close to the drain in the at least two drain junction terminals is greater than that of a drain junction terminal away from the drain in the at least two drain junction terminals.

In some embodiments of the present application, a distance between the gate and a drain junction terminal close to the gate in the at least two drain junction terminals is greater than or equal to a distance between the drain and a drain junction terminal close to the drain in the at least two drain junction terminals.

In some embodiments of the present application, a spacing between two adjacent drain junction terminals close to the gate in the at least two drain junction terminals is greater than or equal to a spacing between two adjacent drain junction terminals close to the drain in the at least two drain junction terminals.

In some embodiments of the present application, the disposing at least two drain junction terminals on one side of the semiconductor layer away from the substrate at intervals includes: growing a growth semiconductor layer on the side of the semiconductor layer away from the substrate; leaving the growth semiconductor layer in a region corresponding to the at least two drain junction terminals and the growth semiconductor layer in a region corresponding to the gate, and removing the growth semiconductor layer in other regions; and providing ohmic electrodes on a remaining growth semiconductor layer corresponding to the at least two drain junction terminals to form the at least two drain junction terminals disposed at intervals. Each of the at least two drain junction terminals is short-circuited to the drain through a corresponding ohmic electrode, so that the at least two drain junction terminals respectively maintain equal potential with the drain.

In some embodiments of the present application, before the disposing at least two drain junction terminals on one side of the semiconductor layer away from the substrate at intervals, the method further includes: disposing a gate trench on the side of the semiconductor layer away from the substrate, a position of the gate trench corresponding to a position of the gate. And the leaving the growth semiconductor layer in a region corresponding to the at least two drain junction terminals and the growth semiconductor layer in a region corresponding to the gate includes: leaving the growth semiconductor layer in the region corresponding to the at least two drain junction terminals and the growth semiconductor layer in the gate trench.

According to a semiconductor device and a method for manufacturing the same provided in the embodiments of the present application, by providing at least two drain junction terminals on one side of a semiconductor layer away from a substrate in the semiconductor device, a concentration of a two-dimensional electron gas at an interface between a channel layer and a barrier layer corresponding to an interval region between the drain junction terminals may not decrease, and the concentration of the two-dimensional electron gas corresponding to the interval region between the drain junction terminals may be maintained at a normal level without increasing an on-resistance of the semiconductor device, which improves the operating efficiency of the device, reduces the energy loss of the device, and further improves the long-term reliability of the device.

BRIEF DESCRIPTION OF DRAWINGS

In order to explain the embodiments of the present application more clearly, the accompanying drawings used in the description of the embodiments will be briefly introduced below. Obviously, the accompanying drawings in the following description are just some embodiments described in the present application. For those of ordinary skill in the art, other accompanying drawings may be obtained based on these accompanying drawings without creative efforts.

Icons: 100—semiconductor device; 101—substrate; 102—semiconductor layer; 121—channel layer; 122—barrier layer; 123—nucleation layer; 124—buffer layer; 103—source; 104—gate; 141—gate trench; 105—drain; 106—drain junction terminal; 161—growth semiconductor layer; 162—ohmic electrode; 1061—first drain junction terminal; 1062—second drain junction terminal; 1063—third drain junction terminal; 107—dielectric layer; 20—two-dimensional electron gas.

DETAILED DESCRIPTION OF THE EMBODIMENTS

In order to make the objectives, technical solutions, and advantages of the present application clearer, the technical solutions of the present application will be described in detail through specific embodiments in combination with the accompanying drawings in the embodiments of the present application. Obviously, the described embodiments are a part, but not all of the embodiments of the present application. Based on the embodiments of the present application, all other embodiments obtained by a person of ordinary skill in the art without creative efforts shall fall within the protection scope of the present application.

Figure 1:
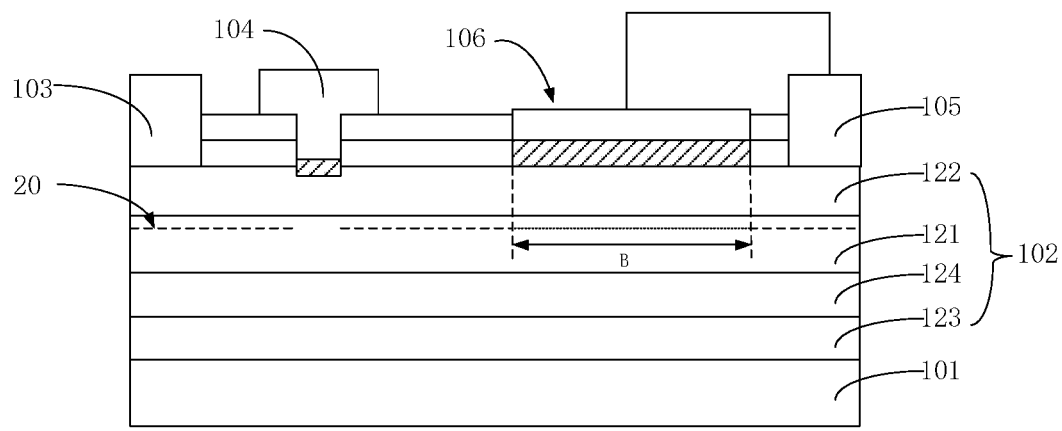
FIG. 1 is a schematic structural diagram illustrating a semiconductor device according to an embodiment of the present application.

FIG. 1 is a semiconductor device 100 according to an embodiment of the present application. As shown in FIG. 1, the semiconductor device 100 includes: a substrate 101, a semiconductor layer 102, a source 103, a gate 104, a drain 105, and a drain junction terminal 106.

Figure 2:
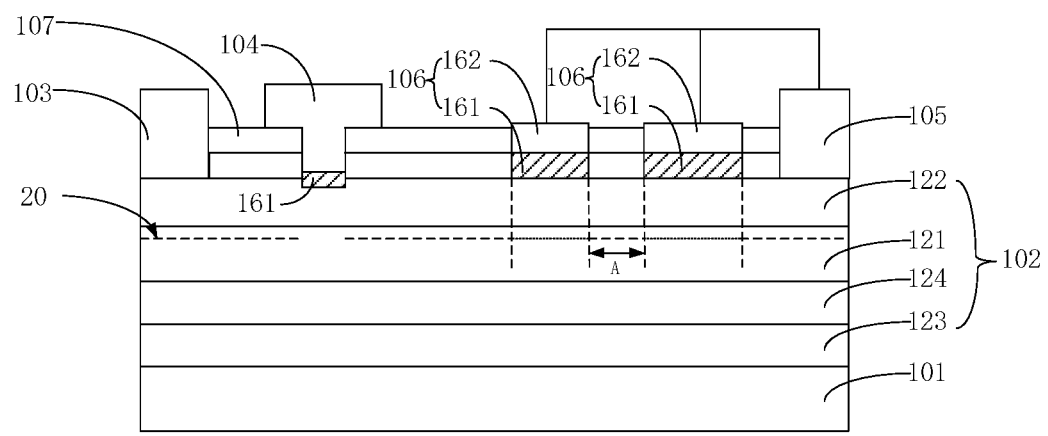
FIG. 2 is a schematic structural diagram illustrating a semiconductor device according to another embodiment of the present application.

FIG. 2 is a semiconductor device according to another embodiment of the present application. As shown in FIG. 2, the semiconductor device includes: a substrate 101, a semiconductor layer 102, a source 103, a gate 104, a drain 105, and at least two drain junction terminals 106.

In this embodiment, the substrate 101 may be a sapphire substrate, a SiC substrate, a GaN substrate, a Si substrate, or any other substrate suitable for growing a Group III nitride material known to those skilled in the art, which is not limited in the present application.

The semiconductor layer 102 is fabricated on one side of the substrate 101. The semiconductor layer 102 includes a channel layer 121 and a barrier layer 122. A semiconductor heterojunction is formed between the channel layer 121 and the barrier layer 122. Polarization charges at an interface of the heterojunction introduce a high concentration of two-dimensional electron gas, so that the two-dimensional electron gas 20 is formed at the interface between the channel layer 121 and the barrier layer 122.

The source 103, the gate 104, and the drain 105 are formed on one side of the semiconductor layer 102 away from the substrate 101. The source 103 and the drain 105 are electrically connected to the two-dimensional electron gas 20 in the semiconductor layer 102.

The gate 104 is in a region between the source 103 and the drain 105. The gate 104 may be a Schottky metal gate or an insulated gate (MIS). The metal gate may be a single-layer metal gate, or may be a double-layer or multilayer gate structure. For example, a lower layer is an insulating medium (such as SiO$_2$), and an upper layer is a gate metal. The gate 104 may be a multilayer metal. It should be understood that a method for forming the gate 104 described here is merely an example, and the gate 104 in the embodiments of the present application may be formed by any method known to those skilled in the art. The gate 104 may be a T-shaped gate structure, a F-shaped gate structure, a trapezoidal field plate, or the like.

In the embodiments of the present application, the drain junction terminals 106 are disposed on one side of the semiconductor layer 102 away from the substrate 101 and are located between the gate 104 and the drain 105. The number of the drain junction terminals 106 is at least two. The at least two drain junction terminals 106 are disposed at intervals, and there is a gap between two adjacent drain junction terminals 106. The at least two drain junction terminals 106 are electrically connected to the drain 105 respectively.

The drain junction terminal 106 may be made of a P-type III-V compound semiconductor, and those skilled in the art may select a material of the drain junction terminal 106 according to actual needs, which is not limited in the embodiments of the present application.

For a III-V compound semiconductor device with a conventional structure, when the drain is in a high-voltage bias state, an electron trap between the source and the drain captures electrons. These captured electrons cannot be released immediately when the device is turned on. During the process for slowly releasing and recovering these captured electrons, the electrons in the channel layer are repelled, which results in a decrease in an electron concentration in the channel layer and ultimately leads to an increase in the dynamic resistance of the device. The increase of the dynamic resistance of the device may increase the thermal loss of the device and even cause the device to burn out.

According to an embodiment of the present invention, the at least two drain junction terminals 106 are respectively short-circuited to the drain 105 to maintain equal potential with the drain 105.

As shown in FIG. 1, when one drain junction terminal 106 is provided between the gate 104 and the drain 105, since the drain junction terminal 106 is short-circuited to the drain 105, when a positive voltage is applied to the drain 105, holes in the semiconductor of the drain junction terminal 106 are injected into a surface or an inside of the barrier layer 122. During the switching process of the device, the injected holes may effectively release the captured electrons and neutralize the electrons captured by the electron trap, thereby eliminating the current collapse phenomenon and reducing the dynamic resistance of the device.

In the embodiment shown in FIG. 1, since the drain junction terminal 106 weakens the piezoelectric effect between the barrier layer 122 and the channel layer 121, an energy band of the structure of the device is changed, thereby reducing the concentration of the two-dimensional electron gas 20 at the interface between the barrier layer 122 and the channel layer 121. The concentration of the two-dimensional electron gas 20 in region B of FIG. 1 may be lower than a normal level. After the concentration of the two-dimensional electron gas is decreased, the on-resistance of the device may increase. The increase in the on-resistance may reduce the efficiency of the device, increase the energy loss, and reduce the long-term reliability of the device.

In the embodiment shown in FIG. 2, the holes in the at least two drain junction terminals 106 may be injected into the surface of the barrier layer 122 or the inside of the barrier layer 122. During the switching process of the device, the injected holes may effectively release the captured electrons and neutralize the electrons captured by the electron trap, thereby eliminating the current collapse phenomenon and reducing the dynamic resistance of the device. Since there is a distance between adjacent drain junction terminals 106 in the at least two drain junction terminals 106, the concentration of the two-dimensional electron gas at the interface between the barrier layer 122 and the channel layer 121 corresponding to the region between two adjacent drain junction terminals 106 is higher than the concentration of the corresponding two-dimensional electron gas under one drain junction terminal 106 (shown in FIG. 1). As shown in FIG. 2, the region A is a region between two drain junction terminals 106, and the concentration of the two-dimensional electron gas 20 corresponding to this region is at a normal level. A structure provided with the at least two drain junction terminals 106 has a higher concentration of two-dimensional electron gas than a structure provided with one drain junction terminal 106 in FIG. 1, so the on-resistance of the device may be reduced and the efficiency of the device may be improved, thereby reducing the energy loss of the device and improving the reliability of the device.

According to a semiconductor device provided in the embodiments of the present application, by providing at least two drain junction terminals on one side of a semiconductor layer away from a substrate in the semiconductor device, a concentration of a two-dimensional electron gas at an interface between a channel layer and a barrier layer corresponding to an interval region between the drain junction terminals may not decrease, and the concentration of the two-dimensional electron gas corresponding to the interval region between the drain junction terminals may be maintained at a normal level without increasing an on-resistance of the semiconductor device, which improves the operating efficiency of the device, reduces the energy loss of the device, and further improves the long-term reliability of the device.

Figure 3:
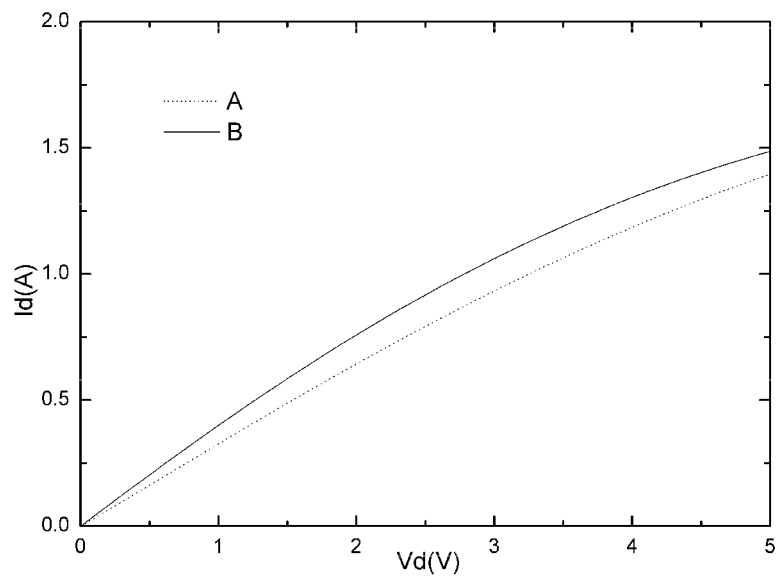
FIG. 3 is a comparison diagram illustrating the effects of the structures according to the embodiments shown in FIG. 1 and FIG. 2.

FIG. 3 is a comparison diagram illustrating the technical effects of the structure shown in FIG. 1 and the structure shown in FIG. 2. A dotted line A is a curve of a source-drain current changing with a drain voltage corresponding to the structure shown in FIG. 1, and a solid line B is a curve of a source-drain current changing with a drain voltage corresponding to the structure shown in FIG. 2. It may be seen that under the same drain voltage Vd, the current of the solid line B is much larger than the current of the dotted line A. Therefore, compared with the structure shown in FIG. 1, the structure shown in FIG. 2 has the advantage of lower on-resistance in addition to the effect of reducing current collapse.

According to an embodiment of the present application, a spacing between two adjacent drain junction terminals close to the gate is greater than or equal to a spacing between two adjacent drain junction terminals close to the drain. The effect for the spacing setting is to reduce current collapse while maintaining a low on-resistance without reducing the concentration of the two-dimensional electron gas between the channel layer and the barrier layer.

Optionally, among the at least two drain junction terminals, a distance between the gate and a drain junction terminal close to the gate is greater than or equal to a distance between the drain and a drain junction terminal close to the drain.

Figure 4:
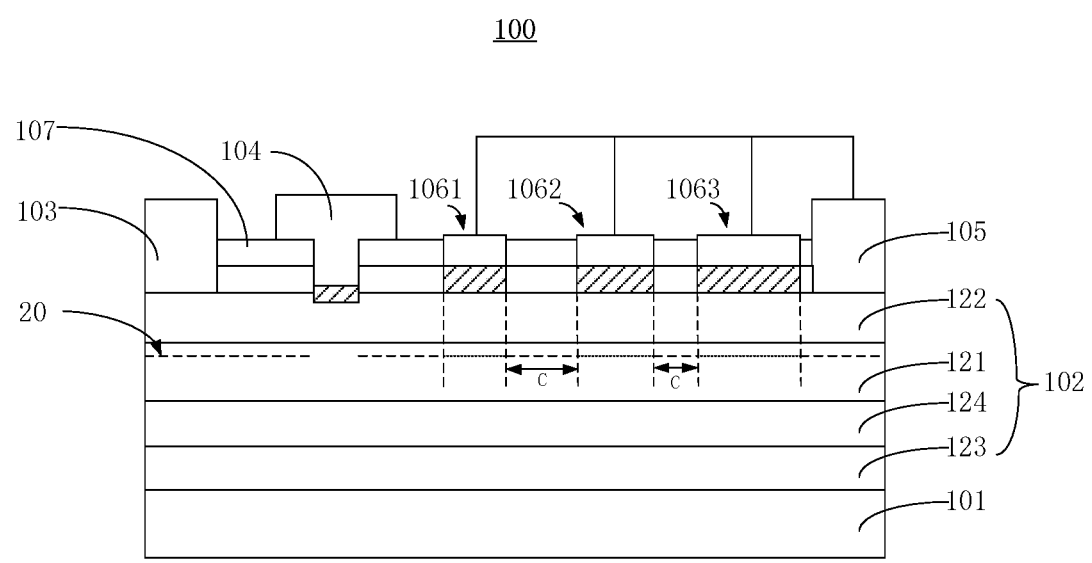
FIG. 4 is a schematic structural diagram illustrating a semiconductor device according to still another embodiment of the present application.

In a specific embodiment, as shown in FIG. 4, the at least two drain junction terminals 106 include a first drain junction terminal 1061, a second drain junction terminal 1062, and a third drain junction terminal 1063. The first drain junction terminal 1061 is disposed close to the gate 104, the third drain junction terminal 1063 is disposed close to the drain 105, and the second drain junction terminal 1062 is located between the first drain junction terminal 1061 and the third drain junction terminal 1063. A spacing between the first drain junction terminal 1061 and the second drain junction terminal 1062 is greater than a spacing between the second drain junction terminal 1062 and the third drain junction terminal 1063.

In this embodiment, in a direction in which the gate 104 faces the drain 105, a spacing between two adjacent drain junction terminals in the at least two drain junction terminals 106 gradually decreases, which may ensure that the electrons captured near the drain 105 recover relatively fast, and may better reduce the memory effect.

It may be understood that an extension length of the first drain junction terminal 1061 is the shortest, an extension length of the second drain junction terminal 1062 is longer than that of the first drain junction terminal 1061, and an extension length of the third drain junction terminal 1063 may be longer than that of the second drain junction terminal 1062. By setting three drain junction terminals 106, the concentration of the two-dimensional electron gas corresponding to a region C between two adjacent drain junction terminals 106 in FIG. 4 is at a normal level. Compared with the case where one drain junction terminal 106 is provided in FIG. 1, the concentration of the two-dimensional electron gas of the device in FIG. 4 is higher than the concentration of the two-dimensional electron gas of the device in FIG. 1.

According to an embodiment of the present application, referring to FIG. 2, each drain junction terminal 106, in the embodiments of the present application, includes a growth semiconductor layer 161 (also referred to as a first growth semiconductor layer) and an ohmic electrode 162.

Specifically, the first growth semiconductor layer 161 is grown on one side of the semiconductor layer 102 away from the substrate 101. The ohmic electrode 162 is fabricated on one side of the first growth semiconductor layer 161 away from the semiconductor layer 102. Each drain junction terminal 106 is short-circuited to the drain 105 through the ohmic electrode 162.

A growth semiconductor layer 161 (also referred to as a second growth semiconductor layer) is grown between the gate 104 and the barrier layer 122. At least a portion of the second growth semiconductor layer 161 extends to a surface or an inside of the barrier layer 122, or an inside of the channel layer 121. The first growth semiconductor layer 161 forming the drain junction terminal 106 may be fabricated simultaneously with the second growth semiconductor layer 161 between the gate 104 and the barrier layer 122. A thickness of the second growth semiconductor layer 161 is smaller than that of the first growth semiconductor layer 161.

According to an embodiment of the present application, as shown in FIG. 2, the semiconductor device 100 further includes a dielectric layer 107 located above the barrier layer 122. A gate trench may be formed on the dielectric layer 107. The gate trench may extend from the dielectric layer 107 to the barrier layer 122, or the gate trench may extend from the dielectric layer 107 to an inside of the channel layer 121. The growth semiconductor layer 161 between the gate 104 and the barrier layer 122 is located in the gate trench.

The dielectric layer 107 may be one or more layers. The dielectric layer 107 may be made of a crystalline material deposited during the growth or process, such as GaN or AN, etc.; or it may be made of an amorphous material deposited during the growth or technological process, such as SiN, etc. The material of the dielectric layer 107 is not limited in the embodiments of the present application.

According to an embodiment of the present application, the at least two drain junction terminals extend from the gate to the drain, and the thickness of the drain junction terminal close to the drain is greater than that of the drain junction terminal away from the drain. In this way, by providing one drain junction terminal with a large thickness near the drain, the drain junction terminal has a better compound effect on the defects beneath the drain junction terminal. During the switching process of the device, a concentration of the holes injected into the drain junction terminal is relatively high, which may effectively release the captured electrons and neutralize the electrons captured by the electron trap, thereby eliminating the current collapse phenomenon and reducing the dynamic resistance of the device. At the same time, in this embodiment, the phenomenon that the concentration of the 2DEG decreases and the on-resistance of the device becomes excessive due to the excessively thick drain junction terminal close to the gate is avoided. That is, in this embodiment, the device may have a low current collapse effect, a low dynamic resistance, and a low on-resistance, thereby improving the operating efficiency of the device, reducing the energy loss of the device, and improving the long-term reliability of the device.

According to an embodiment of the present application, in a direction in which the gate 104 faces the drain 105, a thickness of the at least two drain junction terminals 106 gradually increases.

According to an embodiment of the present application, the semiconductor layer 102 may further include a nucleation layer 123 and a buffer layer 124. The nucleation layer 123 is formed on one side of the substrate 101. The buffer layer 124 is formed on one side of the nucleation layer 123 away from the substrate 101. The nucleation layer 123 is located between the substrate 101 and the buffer layer 124, and the buffer layer 124 is located between the channel layer 121 and the nucleation layer 123.

Figure 5:
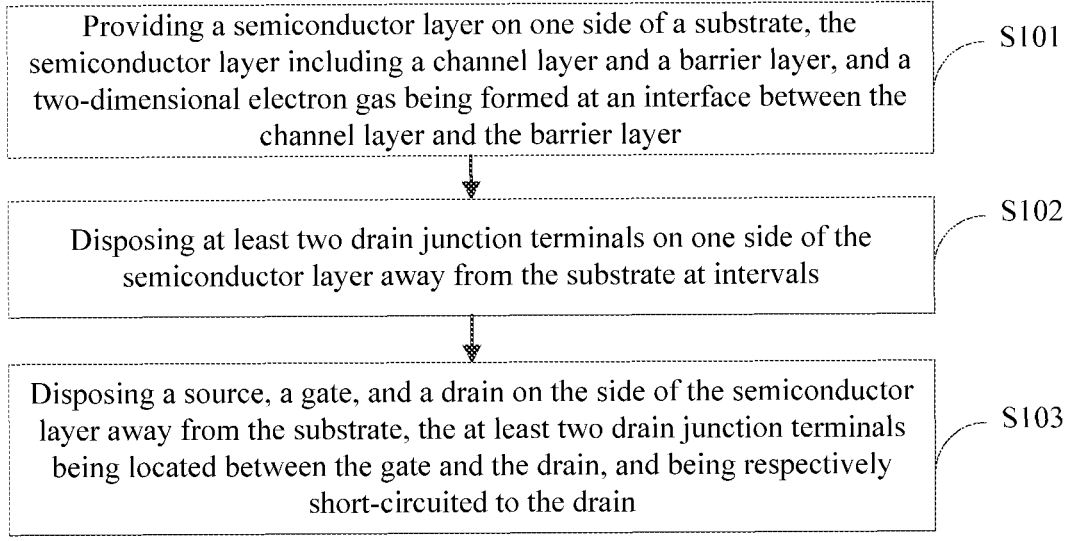
FIG. 5 is a schematic flowchart illustrating a method for manufacturing a semiconductor device according to an embodiment of the present application.

The embodiments of the present application further provide a method for manufacturing the semiconductor device 100. As shown in FIG. 5, the method includes the following content.

S101: providing a semiconductor layer on one side of a substrate 101, the semiconductor layer 102 including a channel layer 121 and a barrier layer 122, and a two-dimensional electron gas being formed at an interface between the channel layer 121 and the barrier layer 122.

Specifically, a material of the substrate may be found in the above description about FIG. 2, which will not be described herein again. A deposition method of the substrate 101 includes CVD, VPE, MOCVD, LPCVD, PECVD, Pulsed Laser Deposition (PLD), atomic layer epitaxy, MBE, sputtering, evaporation, and the like. The material of the substrate and the growth method thereof are not limited in the embodiments of the present application.

S102: disposing at least two drain junction terminals 106 on one side of the semiconductor layer 102 away from the substrate 101 at intervals.

S103: disposing a source 103, a gate 104, and a drain 105 on the side of the semiconductor layer 102 away from the substrate 101, the at least two drain junction terminals 106 being located between the gate 104 and the drain 105, and being respectively short-circuited to the drain 105.

Specifically, in this embodiment, a manner in which the source 103 and the drain 105 are electrically connected to the two-dimensional electron gas 20 in the semiconductor layer 102 (or a method for forming the source 103 and the drain 105) may be, but is not limited to, the following: a) high temperature annealing; b) ion implantation; and c) heavily doped. In the case that the high temperature annealing is performed, electrode metals of the source 103 and the drain 105 are electrically connected to the two-dimensional electron gas 20 formed in the semiconductor layer 102. In the case that the ion implantation or the heavily doped is performed, the source 103 and the drain 105 are respectively composed of an ion implanted portion or a heavily doped portion and an electrode thereon, and the ion implanted portion or the heavily doped portion is electrically connected to the two-dimensional electron gas 20 formed in the semiconductor layer 102. It should be understood that the method for forming the source 103 and the drain 105 described here is only an example, and the source 103 and the drain 105 in the embodiments of the present application may be formed by any method known to those skilled in the art.

The specific structure of the gate 104 may be reffered to the description about FIG. 2 above. To avoid repetition, details are not described herein again.

According to a method for manufacturing a semiconductor device provided in the embodiments of the present application, by providing at least two drain junction terminals on one side of a semiconductor layer away from a substrate in the semiconductor device, a concentration of a two-dimensional electron gas at an interface between a channel layer and a barrier layer corresponding to an interval region between the drain junction terminals may not decrease, and the concentration of the two-dimensional electron gas corresponding to the interval region between the drain junction terminals may be maintained at a normal level without increasing an on-resistance of the semiconductor device, which improves the operating efficiency of the device, reduces the energy loss of the device, and further improves the long-term reliability of the device.

According to an embodiment of the present application, the at least two drain junction terminals 106 are disposed along an extension direction from the gate 104 to the drain 105, and a length of a drain junction terminal 106 close to the drain 105 in the extension direction is greater than that of a drain junction terminal 106 close to the gate 104 in the extension direction.

According to an embodiment of the present application, the at least two drain junction terminals 106 are disposed along an extension direction from the gate 104 to the drain 105, and a thickness of a drain junction terminal 106 close to the drain 105 is greater than that of a drain junction terminal 106 away from the drain 105.

According to an embodiment of the present application, among the at least two drain junction terminals 106, a distance between the gate 104 and a drain junction terminal 106 close to the gate 104 is greater than or equal to a distance between the drain 105 and a drain junction terminal 106 close to the drain 105.

According to an embodiment of the present application, a spacing between two adjacent drain junction terminals 106 close to the gate 104 is greater than or equal to a spacing between two adjacent drain junction terminals 106 close to the drain 105.

According to an embodiment of the present application, the at least two drain junction terminals 106 include a first drain junction terminal 1061, a second drain junction terminal 1062, and a third drain junction terminal 1063. The first drain junction terminal 1061 is disposed close to the gate 104, the third drain junction terminal 1063 is disposed close to the drain 105, and the second drain junction terminal 1062 is located between the first drain junction terminal 1061 and the third drain junction terminal 1063. A spacing between the first drain junction terminal 1061 and the second drain junction terminal 1062 is greater than a spacing between the second drain junction terminal 1062 and the third drain junction terminal 1063.

According to an embodiment of the present application, the step S102 includes: growing a growth semiconductor layer on one side of the semiconductor layer 102 away from the substrate 101; leaving the growth semiconductor layer in a region corresponding to the at least two drain junction terminals 106 and the growth semiconductor layer in a region corresponding to the gate 104, and removing the growth semiconductor layer in other regions; and providing ohmic electrodes on the remaining growth semiconductor layer corresponding to the at least two drain junction terminals 106 to form the at least two drain junction terminals 106 disposed at intervals.

In this embodiment, the growth semiconductor layer in the region corresponding to the gate 104 may be located on a surface of the semiconductor layer 102, or a portion of the growth semiconductor layer is located inside the semiconductor layer 102.

According to an embodiment of the present application, before the step S102, the method further includes: disposing a gate trench 141 on the side of the semiconductor layer 102 away from the substrate 101, a position of the gate trench 141 corresponding to a position of the gate 104. The leaving the growth semiconductor layer in a region corresponding to the at least two drain junction terminals 106 and the growth semiconductor layer in a region corresponding to the gate 104 includes: leaving the growth semiconductor layer in the region corresponding to the at least two drain junction terminals 106 and the growth semiconductor layer in the gate trench 141.

Figure 6:
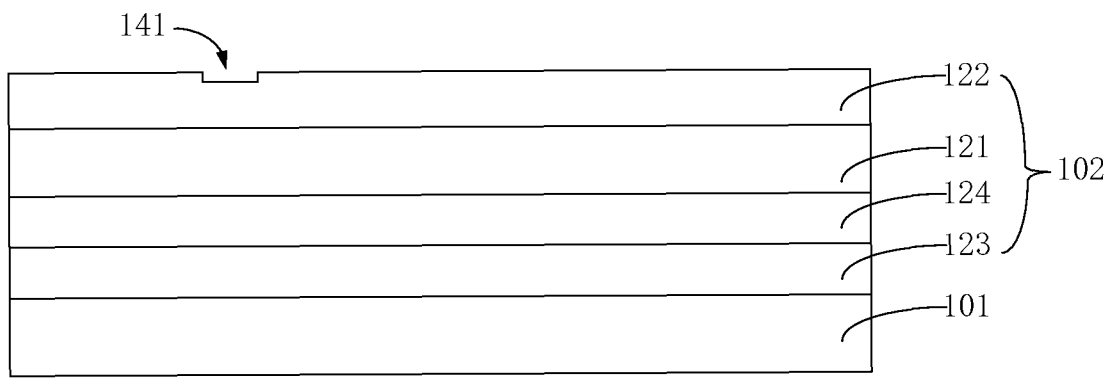
FIG. 6 to FIG. 9 are schematic structural diagrams illustrating each step of a method for manufacturing a semiconductor device according to an embodiment of the present application.

Specifically, as shown in FIG. 6, the gate trench 141 corresponding to the gate 104 is fabricated in the region corresponding to the gate 104.

Figure 7:
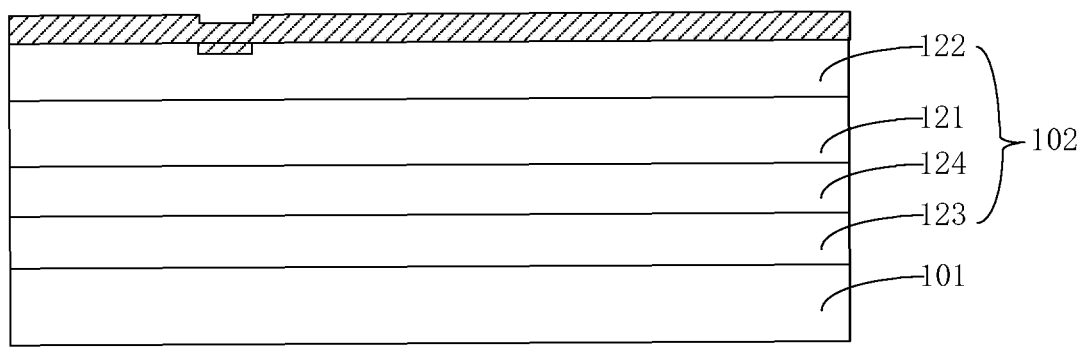
Figure 8:
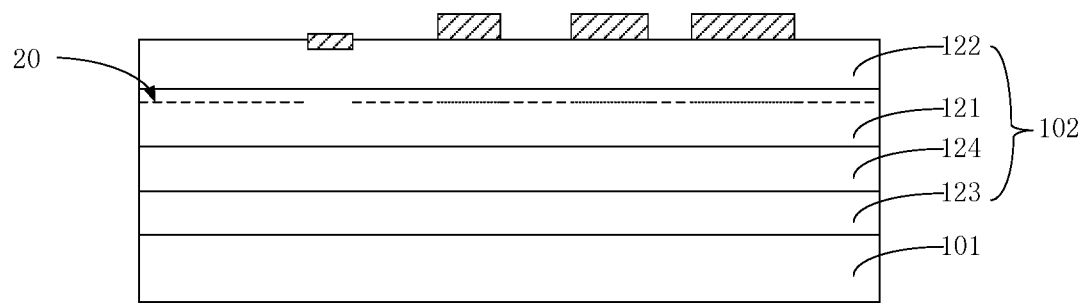
Figure 9:
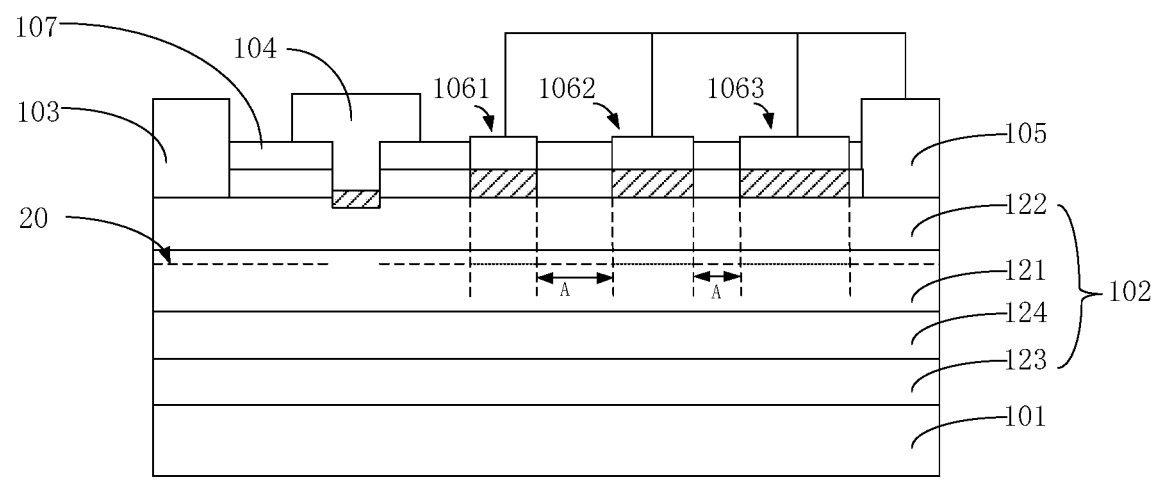

In this embodiment, a process for fabricating the drain junction terminals 106 may include: as shown in FIG. 7, firstly, growing one growth semiconductor layer 161 on one side of the semiconductor layer 102 away from the substrate 101, a thickness of the growth semiconductor layer 161 being less than that of the dielectric layer; as shown in FIG. 8, then leaving the growth semiconductor layer 161 in the region corresponding to the at least two drain junction terminals 106 and the growth semiconductor layer 161 in the gate trench 141, and removing the growth semiconductor layer 161 in other regions; and as shown in FIG. 9, finally forming the ohmic electrodes 162 on the remaining growth semiconductor layer 161 corresponding to the drain junction terminals 106 to form the at least two drain junction terminals 106 disposed at intervals.

The position and number of the growth semiconductor layers 161 corresponding to the drain junction terminals 106, and the spacing between the drain junction terminals 106 may be determined according to actual needs, and the required growth semiconductor layers 161 are retained.

The growth semiconductor layer 161 constituting the drain junction terminal 106 and the growth semiconductor layer 161 under the gate 104 may not be prepared in the same step, and the thicknesses of the two may be the same or different.

A process method for manufacturing the source 103, the gate 104, and the drain 105 may be determined according to actual needs, and one or more dielectric layers 107 may also be manufactured on the side of the semiconductor layer 102 away from the substrate 101. After the drain 105 is fabricated, the at least two drain junction terminals 106 may be respectively short-circuited to the drain 105.

According to an embodiment of the present application, the semiconductor layer 102 further includes: a nucleation layer 123 disposed on one side of the substrate 101; and a buffer layer 124 disposed on one side of the nucleation layer 123 away from the substrate 101. The nucleation layer 123 is located between the substrate 101 and the buffer layer 124, and the buffer layer 124 is located between the channel layer 121 and the nucleation layer 123.

It should be noted that the above are only the preferred embodiments and the applied technical principles of the present application. Those skilled in the art may understand that the present application is not limited to the specific embodiments described herein, and those skilled in the art can make various obvious changes, readjustments and substitutions without departing from the protection scope of the present application. Therefore, although the present application has been described in more detail through the above embodiments, the present application is not limited to the above embodiments. Without departing from the concept of the present application, more other equivalent embodiments may be included in the present application, and the protection scope of the present application is determined by the scope of the appended claims.

What is claimed is:

1. A semiconductor device, comprising:
   a substrate;
   a semiconductor layer disposed on one side of the substrate, the semiconductor layer comprising a channel layer and a barrier layer, and a two-dimensional electron gas being formed at an interface between the channel layer and the barrier layer;
   a source, a gate, and a drain disposed on one side of the semiconductor layer away from the substrate; and
   at least two drain junction terminals located on the side of the semiconductor layer away from the substrate and disposed at intervals between the gate and the drain, the at least two drain junction terminals being electrically connected to the drain respectively,
   wherein the at least two drain junction terminals are disposed along an extension direction from the gate to the drain, and a length of a drain junction terminal close to the drain in the at least two drain junction terminals in the extension direction is greater than that of a drain junction terminal close to the gate in the at least two drain junction terminals in the extension direction,
   wherein a thickness, in a direction perpendicular to the extension direction from the gate to the drain, of a drain junction terminal close to the drain in the at least two drain junction terminals is greater than that of a drain junction terminal away from the drain in the at least two drain junction terminals.

2. The semiconductor device according to claim 1, wherein in a direction in which the gate faces the drain, a thickness of the at least two drain junction terminals gradually increases.

3. The semiconductor device according to claim 1, wherein a distance between the gate and a drain junction terminal close to the gate in the at least two drain junction terminals is greater than or equal to a distance between the drain and a drain junction terminal close to the drain in the at least two drain junction terminals.

4. The semiconductor device according to claim 2, wherein a distance between the gate and a drain junction terminal close to the gate in the at least two drain junction terminals is greater than or equal to a distance between the drain and a drain junction terminal close to the drain in the at least two drain junction terminals.

5. The semiconductor device according to claim 1, wherein a spacing between two adjacent drain junction terminals close to the gate in the at least two drain junction terminals is greater than or equal to a spacing between two adjacent drain junction terminals close to the drain in the at least two drain junction terminals.

6. The semiconductor device according to claim 5, wherein in a direction in which the gate faces the drain, a spacing between two adjacent drain junction terminals in the at least two drain junction terminals gradually decreases.

7. The semiconductor device according to claim 1, wherein the at least two drain junction terminals comprise a first drain junction terminal, a second drain junction terminal, and a third drain junction terminal, the first drain junction terminal is disposed close to the gate, the third drain junction terminal is disposed close to the drain, and the second drain junction terminal is located between the first drain junction terminal and the third drain junction terminal, and a spacing between the first drain junction terminal and the second drain junction terminal is greater than a spacing between the second drain junction terminal and the third drain junction terminal.

8. The semiconductor device according to claim 1, wherein each drain junction terminal of the at least two drain junction terminals comprises:
   a first growth semiconductor layer grown on one side of the semiconductor layer away from the substrate; and
   an ohmic electrode disposed on one side of the first growth semiconductor layer away from the semiconductor layer, the drain junction terminal being short-circuited to the drain through the ohmic electrode, and the at least two drain junction terminals respectively maintaining equal potential with the drain.

9. The semiconductor device according to claim 1, further comprising:
- a second growth semiconductor layer grown between the gate and the barrier layer,
- wherein at least a portion of the second growth semiconductor layer extends to a surface of the barrier layer, an inside of the barrier layer, or an inside of the channel layer.

10. The semiconductor device according to claim 9, further comprising:
- a dielectric layer located above the barrier layer,
- wherein a gate trench is formed on the dielectric layer, and the gate trench extends from the dielectric layer to the surface of the barrier layer, the inside of the barrier layer, or the inside of the channel layer, and the second growth semiconductor layer between the gate and the barrier layer is located in the gate trench.

* * * * *